(12) United States Patent
Kwon et al.

(10) Patent No.: US 12,068,576 B2
(45) Date of Patent: Aug. 20, 2024

(54) OPTICAL WAVEGUIDE DEVICE AND LASER APPARATUS INCLUDING THE SAME

(71) Applicant: ELECTRONICS AND TELECOMMUNICATIONS RESEARCH INSTITUTE, Daejeon (KR)

(72) Inventors: Oh Kee Kwon, Sejong-si (KR); Su Hwan Oh, Daejeon (KR); Chul-Wook Lee, Daejeon (KR); Kisoo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 534 days.

(21) Appl. No.: 17/313,610

(22) Filed: May 6, 2021

(65) Prior Publication Data

US 2022/0029378 A1 Jan. 27, 2022

(30) Foreign Application Priority Data

Jul. 23, 2020 (KR) .................. 10-2020-0091758

(51) Int. Cl.
*H01S 5/026* (2006.01)
*G02B 6/02* (2006.01)
(Continued)

(52) U.S. Cl.
CPC .......... *H01S 5/0261* (2013.01); *G02B 6/0208* (2013.01); *H01S 5/02461* (2013.01); *H01S 5/06256* (2013.01); *H01S 5/125* (2013.01)

(58) Field of Classification Search
CPC .... H01S 5/0261; H01S 5/06256; H01S 5/125; H01S 5/2461
See application file for complete search history.

(56) References Cited

U.S. PATENT DOCUMENTS 7,224,708 B2 5/2007 Sin et al.
7,486,709 B2 2/2009 Hu et al.
(Continued)

FOREIGN PATENT DOCUMENTS

JP 2011233829 A 11/2011
JP 2011258810 A 12/2011
(Continued)

OTHER PUBLICATIONS

Brian R. Bennett et al., "Carrier-Induced Change in Refractive Index of InP, GaAs, and InGaAsP", IEEE Journal of Quantum Electronics, vol. 26, No. 1, Jan. 1990, pp. 113-122.
(Continued)

*Primary Examiner* — Michael Carter
(74) *Attorney, Agent, or Firm* — Rabin & Berdo, P.C.

(57) ABSTRACT

Provided are an optical waveguide device and a laser apparatus including the same. The optical waveguide device includes a peripheral part disposed on an edge region of a substrate, an air pocket disposed on a central region of the substrate within the peripheral part, an optical waveguide comprising a core layer, which is disposed on an upper portion of the substrate within the air pocket to extend in a first direction, and an electrode on the core layer, and a plurality of hinges disposed on the air pocket to connect the optical waveguide to the peripheral part in a second direction crossing the first direction.

13 Claims, 7 Drawing Sheets

(51) Int. Cl.
*H01S 5/024* (2006.01)
*H01S 5/0625* (2006.01)
*H01S 5/125* (2006.01)

(56) References Cited

U.S. PATENT DOCUMENTS

| | | | |
|---|---|---|---|
| 8,422,530 | B2 | 4/2013 | Yoon |
| 8,526,478 | B2 | 9/2013 | Ishimura et al. |
| 8,861,556 | B2 * | 10/2014 | Larson ............... H01S 5/0612 372/98 |
| 10,277,008 | B1 | 4/2019 | An |
| 10,601,201 | B1 | 3/2020 | Sirbu et al. |
| 10,666,014 | B2 | 5/2020 | He et al. |
| 2010/0311195 | A1 | 12/2010 | Matsui et al. |
| 2012/0236890 | A1 * | 9/2012 | Caneau ............... H01S 5/06256 438/22 |
| 2014/0321488 | A1 * | 10/2014 | Chen ............... H01S 5/02461 438/694 |
| 2017/0194764 | A1 * | 7/2017 | Evans ............... G02F 1/2255 |
| 2020/0076155 | A1 * | 3/2020 | Wu ............... H01S 5/06256 |

FOREIGN PATENT DOCUMENTS

| | | |
|---|---|---|
| JP | 2015170750 A | 9/2015 |
| KR | 20120089721 A | 8/2012 |
| KR | 20190074148 A | 6/2019 |
| WO | 2011046898 A1 | 4/2011 |

OTHER PUBLICATIONS

S. L. Woodward et al., "A DBR laser tunable by resistive heating," IEEE Photon. Technol. Lett., vol. 4, No. 12, pp. 1330-1332, Dec. 1992.

S. Wang, "Principles of distributed feedback and distributed Bragg-reflector lasers," IEEE J. Quantum Electron., vol. 10, No. 4, pp. 423-427, Apr. 1974.

T. Koch, et al., "Continuously tunable 1.5 ξm multiple-quantum-well GaInAs/GaInAsP distributed-Bragg-reflector lasers," Electron. Lett., vol. 24, No. 23, pp. 1431-1433, Nov. 1988.

Kimeng Han et al., "Numerical Analysis on Thermal Tuning Efficiency and Thermal Stress of a Thermally Tunable SG-DBR Laser", IEEE Photonics Journal, vol. 8, No. 3, Jun. 2016.

\* cited by examiner

OPTICAL WAVEGUIDE DEVICE AND LASER APPARATUS INCLUDING THE SAME

CROSS-REFERENCE TO RELATED APPLICATIONS

This U.S. non-provisional patent application claims priority under 35 U.S.C. § 119 of Korean Patent Application No. 10-2020-0091758, filed on Jul. 23, 2020, the entire contents of which are hereby incorporated by reference.

BACKGROUND

The present disclosure herein relates to an optical waveguide device, and more particularly, to an optical waveguide device and a laser apparatus including the same.

A typical distributed Bragg reflector-laser apparatus may be a longitudinal single-mode light source and a wavelength tunable laser. A typical distributed Bragg reflector laser apparatus may include a gain section and a distributed Bragg reflector (DBR) section. The gain section and the DBR section may be monolithic integrated in the form of a waveguide in a semiconductor substrate.

SUMMARY

The present disclosure provides an optical waveguide that is capable of uniformly controlling a temperature of an optical waveguide, and a laser apparatus including the same.

The present disclosure provides an optical waveguide device. The optical waveguide device includes: a peripheral part disposed on an edge region of a substrate; an air pocket disposed on a central region of the substrate within the peripheral part; an optical waveguide comprising a core layer, which is disposed on an upper portion of the substrate within the air pocket to extend in a first direction, and an electrode on the core layer; and a plurality of hinges disposed on the air pocket to connect the optical waveguide to the peripheral part in a second direction crossing the first direction.

In an embodiment, the plurality of hinges may include: edge hinges; and center hinges between the edge hinges.

In an embodiment, each of the edge hinges and the center hinges may include: a lower hinge; and an upper hinge on the lower hinge.

In an embodiment, the lower hinge may include a lower clad layer.

In an embodiment, the upper hinge may include an upper clad layer on the lower clad layer.

In an embodiment, the center hinges may be denser than the edge hinges.

In an embodiment, the edge hinges may have a first distance, and the center hinges may have a second distance that is less ½ times than the first distance.

In an embodiment, each of the center hinges may be thicker than each of the edge hinges.

In an embodiment, each of the edge hinges may have a first thickness, and each of the center hinges may have a thickness that is greater twice than the first thickness.

In an embodiment, each of the plurality of hinges may have an M shape.

In an embodiment of the inventive concept, a laser apparatus includes: an active device disposed on one side of a substrate to generate laser light; an optical waveguide device disposed on the other side of the substrate to tune a peak wavelength of the laser light; and a phase controller disposed on the substrate between the active device and the optical waveguide device to control a phase of the laser light. The optical waveguide device may include: a peripheral part disposed on an edge region of the substrate; an air pocket disposed on a central region of the substrate within the peripheral part; an optical waveguide including a core layer, which is disposed on an upper portion of the substrate within the air pocket to extend in a first direction, and an electrode on the core layer; and a plurality of hinges disposed on the air pocket to connect the optical waveguide to the peripheral part in a second direction crossing the first direction.

In an embodiment of the inventive concept, a laser apparatus includes: a substrate having a DBR section, a phase section, and a gain section; a lower clad layer disposed on the substrate; an air pocket disposed between the substrate and the lower clad layer in the DBR section; a core layer disposed on the lower clad layer to extend in a first direction; an upper clad layer disposed on the core layer and the lower clad layer outside the core layer; a protective layer on the upper clad layer in the DBR section and the phase section; electrodes aligned with the core layer and disposed on the protective layer in the DBR section and the phase section and on the upper clad layer in the gain section; and a plurality of hinges disposed in the air pocket and separated from each other in the first direction.

In an embodiment, the plurality of hinges may include: edge hinges disposed at an edge in the DBR section; and center hinges disposed at a center in the DBR section between the edge hinges.

In an embodiment, the center hinges may be denser than the edge hinges.

In an embodiment, the edge hinges may have a first distance, and the center hinges may have a second distance that is less ½ times than the first distance.

In an embodiment, each of the center hinges may be thicker than each of the edge hinges.

In an embodiment, each of the edge hinges may have a first thickness, and each of the center hinges may have a thickness that is greater twice than the first thickness.

In an embodiment, each of the plurality of hinges may have an M shape in a second direction crossing the first direction.

In an embodiment, the air pocket may have an M shape in the second direction.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Embodiments of the present invention will be described in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, the embodiments introduced herein are provided so that the disclosed contents may be thorough and complete, and the spirit of the present invention may be sufficiently conveyed to those skilled in the art, and the present invention is only defined by the scope of the claims. Like reference numerals refer to like elements throughout.

In the following description, the technical terms are used only for explaining a specific embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements. In addition, in the specification, a section, a clad layer, a core layer, and an optical waveguide may be understood as meanings mainly used in the optical field. Since it is according to a preferred embodiment, reference numerals presented in the order of description are not necessarily limited to the order.

Figure 1:
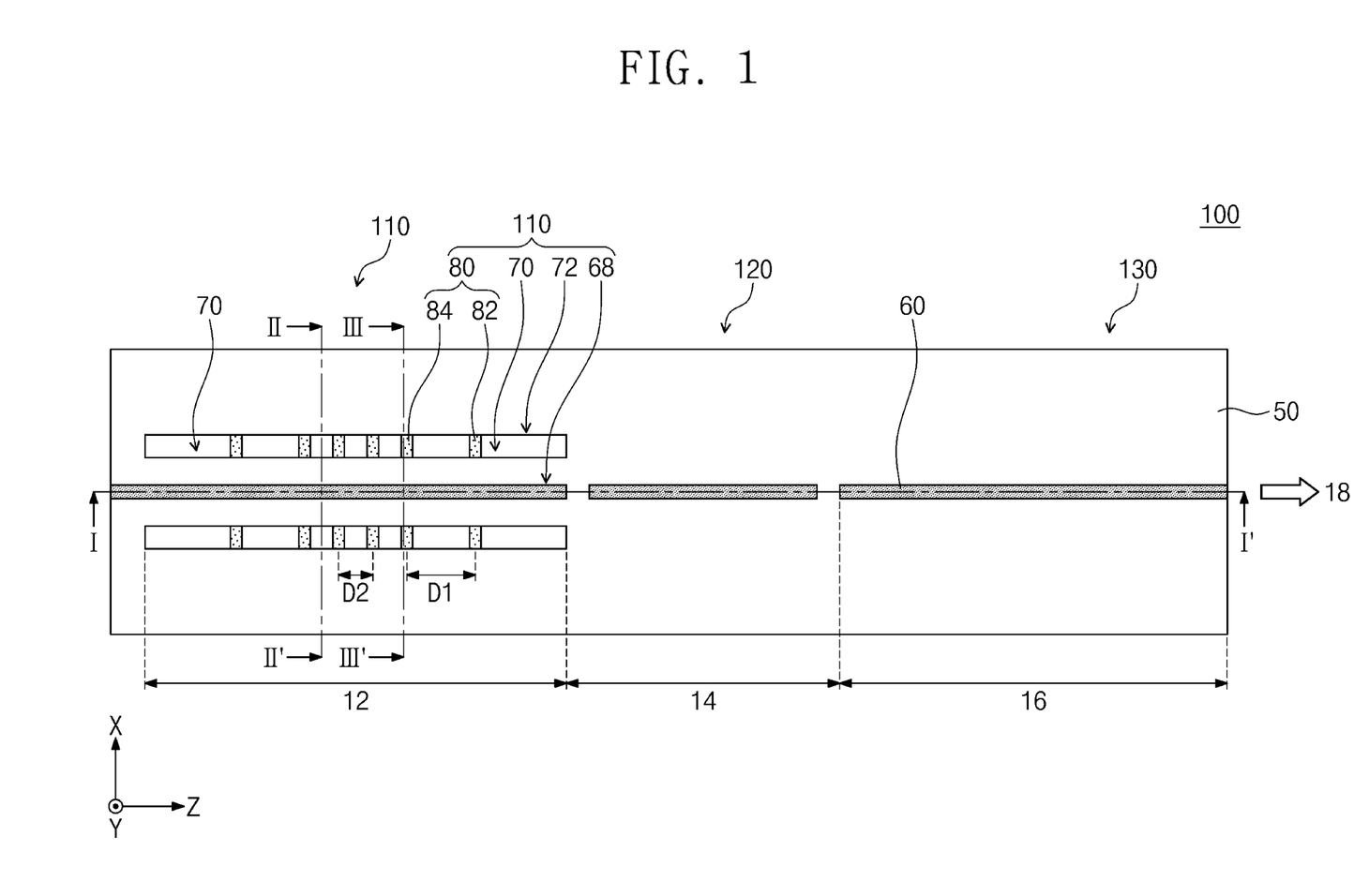
FIG. 1 is a plan view illustrating an example of an optical waveguide device according to an embodiment of the inventive concept.
Figure 2:
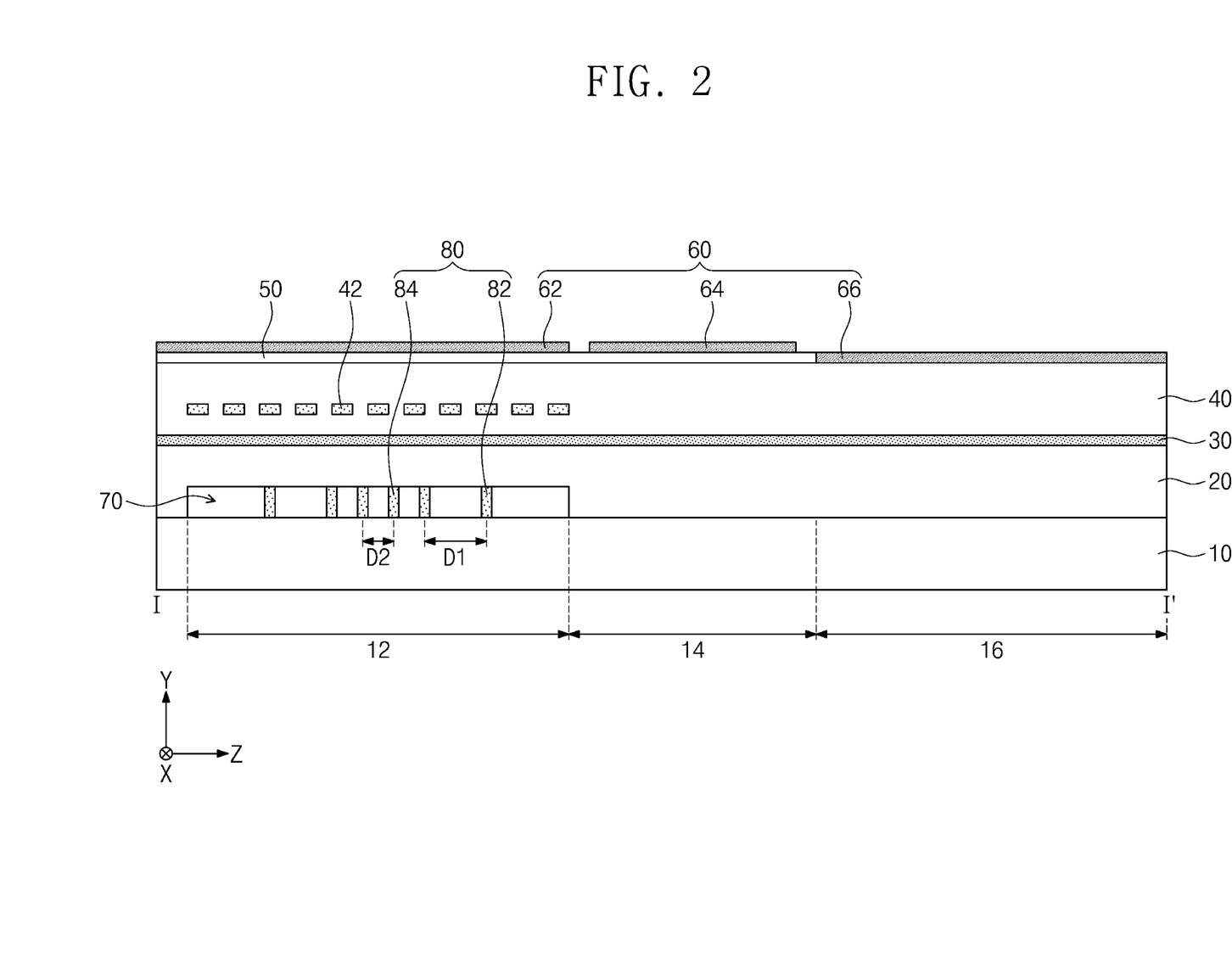
FIG. 2 is a cross-sectional view taken along line I-I' of FIG. 1.

FIG. 1 is a plan view illustrating an example of a laser apparatus 100 according to an embodiment of the inventive concept. FIG. 2 is a cross-sectional view taken along line I-I' of FIG. 1.

Referring to FIGS. 1 and 2, the laser apparatus 100 according to an embodiment of the inventive concept may be a distributed Bragg reflector laser apparatus. For example, the laser apparatus 100 according to an embodiment of the inventive concept may include an optical waveguide device 110, a phase controller 120, and an active device 130. The optical waveguide device 110, the phase controller 120, and the active device 130 may be disposed on a substrate 10 in a first direction Z.

The substrate 10 may include Group III-V semiconductor such as GaAs or GaN. Alternatively, the substrate 10 may include quartz, but the embodiment of the inventive concept is not limited thereto. For example, the substrate 10 may include a DBR section 12, a phase section 14, and a gain section 16. The DBR section 12, the phase section 14, and the gain section 16 may be arranged in a line in the first direction Z, but the embodiment of the inventive concept is not limited thereto.

The optical waveguide device 110, the phase controller 120, and the active device 130 may be disposed on the DBR section 12, the phase section 14, and the gain section 16, respectively. For example, each of the optical waveguide device 110, the phase controller 120, and the active device 130 may include a lower clad layer 20, a core layer 30, an upper clad layer 40, and a protective layer 50, and electrodes 60.

The lower clad layer 20 may be disposed on the substrate 10. The lower clad layer 20 may include InP having a first conductivity type (e.g., n-type). The lower clad layer 20 may have a refractive index greater than that of the substrate 10.

An air pocket 70 may be provided between the substrate 10 and the lower clad layer 20 in the DBR section 12. Air having a normal pressure (e.g., about 1 atmosphere or about 760 Torr) may be filled in the air pocket 70. Air in the air pocket 70 may have a refractive index lower than that of the lower clad layer 20. Also, the air in the air pocket 70 may have thermal conductivity less than that of the lower clad layer 20.

A plurality of hinges 80 may be provided in the air pocket 70. The plurality of hinges 80 may allow the lower clad layer 20, the core layer 30, the upper clad layer 40, and the protective layer 50 on the air pocket 70 to increase in temperature uniformity. For example, the plurality of hinges 80 may include edge hinges 82 and center hinges 84. The edge hinges 82 may be disposed on an edge of the DBR section 12. The center hinges 84 may be disposed at a center of the DBR section 12. The center hinges 84 may be disposed between the edge hinges 82. For example, each of the edge hinges 82 may have a first distance D1 from each of the center hinges 84. The center hinges 84 may be arranged densely when compared to the edge hinges 82. The center hinges 84 may have a second distance D2 less than the first distance D1. For example, the first distance D1 may be twice the second distance D2. That is, the center hinges 84 may have a second distance D2 that is less ½ times than the first distance D1.

The core layer 30 may be disposed on the lower clad layer 20. The core layer 30 may extend in the first direction Z. The core layer 30 may have a refractive index greater than that of each of the lower clad layer 20 and the upper clad layer 40. The core layer 30 may include InGaAsP. The core layer 30 in the gain section 16 may have a gain material. The gain material may include Nd:YAG, Nd:YLF, neodymium glass, titanium sapphire, Yb:YAG, or Ytterbium doped glass laser. The core layer 30 in the DBR section 12 may have a gain material, but the embodiment of the inventive concept is not limited thereto. Although not shown, reflective layers may be provided on opposite sidewalls of the core layer 30, the lower clad layer 20, and the upper clad layer 40. The reflective layers may include a total reflection layer and a half reflection layer. The core layer 30 in the gain section 16 may obtain a gain of the laser light 18. The laser light 18 may be reflected between the total reflection layer and the half reflection layer. The laser light 18 may be transmitted along the core layer 30. A portion of the laser light 18 may be irradiated to the outside by being transmitted through the half reflective layer.

The upper clad layer 40 may be disposed on the core layer 30 and the lower clad layer 20 outside the core layer 30. The upper clad layer 40 may include InP having a second conductivity type (e.g., p-type). The upper clad layer 40 may have a refractive index lower than that of the core layer 30. For example, the upper clad layer 40 may have a Bragg grating 42. Alternatively, the Bragg grating 42 may be provided in the core layer 30 or in the lower clad layer 20 under the core layer 30, but the embodiment of the inventive concept is not limited thereto. The Bragg grating 42 may reflect a portion of the laser light 18 to control a wavelength interval of the laser light 18.

The protective layer 50 may be disposed on the upper cladding layer 40 in the DBR section 12 and the phase section 14. The protective layer 50 may include a dielectric (e.g., SiO2, or SiN). The protective layer 50 may locally expose the upper clad layer 40 in the gain section 16.

The electrodes 60 may be disposed on the protective layer 50 in the DBR section 12 and the phase section 14 and may be disposed on the upper clad layer 40 in the gain section 16. The electrodes 60 may be aligned on the core layer 30. For example, the electrodes 60 may include a first heater electrode 62, a second heater electrode 64, and a contact electrode 66.

The first heater electrode 62 may be disposed on the protective layer 50 in the DBR section 12. The first heater electrode 62 may heat the upper clad layer 40 and the core layer 30 in the DBR section 12 to tune a wavelength of the laser light 18.

The second heater electrode 64 may be disposed on the protective layer 50 in the phase section 14. The second heater electrode 64 may shift a phase of the laser light 18 by heating the upper clad layer 40, the core layer 30, and the lower clad layer 20 in the phase section 14.

The contact electrode 66 may be disposed on the upper clad layer 40 in the gain section 16. The contact electrode 66 may generate current and/or electric fields in the upper clad layer 40, the core layer 30, and the lower clad layer 20 to increase in power of the laser light 18.

Figure 3:
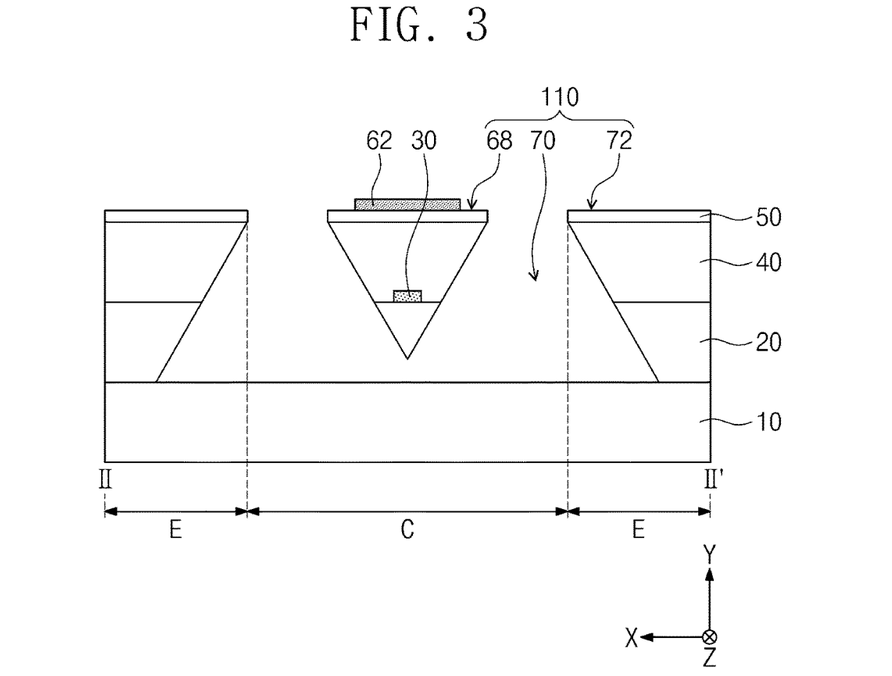
FIG. 3 is a cross-sectional view taken along line II-IF of FIG. 1.
Figure 4:
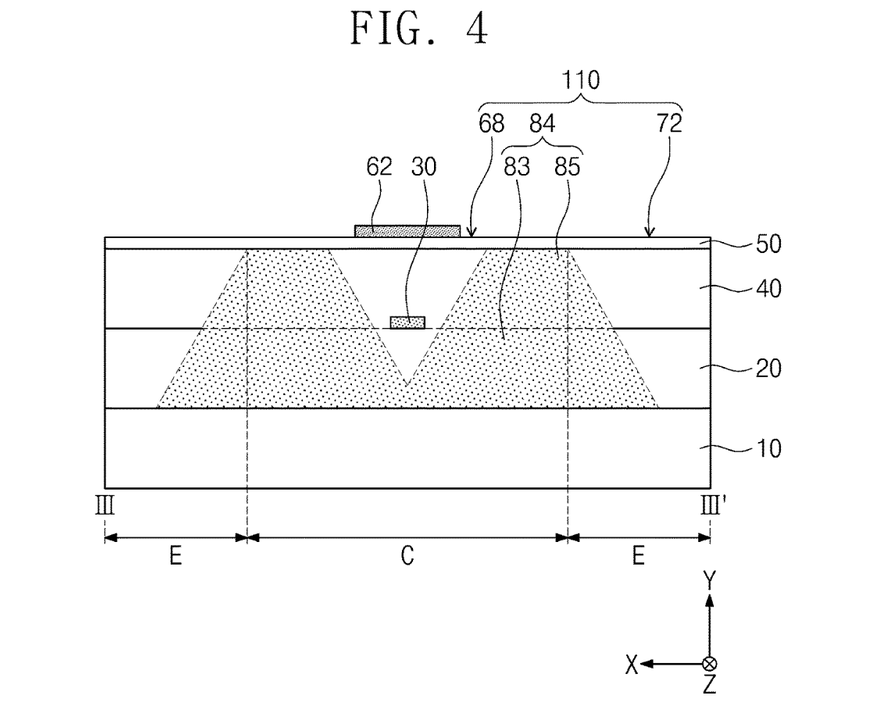
FIG. 4 is a cross-sectional view taken along line of FIG. 1.

FIG. 3 is a cross-sectional view taken along line II-IF of FIG. 1. FIG. 4 is a cross-sectional view taken along line of FIG. 1.

Referring to FIGS. 1 to 4, the optical waveguide device 110 may include an air pocket 70, an optical waveguide 68, a peripheral parts 72, and hinges 80.

The air pocket 70 may have a '=' shape in the plan view. The air pocket 70 may be disposed in a central region C of the substrate 10. The air pocket 70 may be provided between the substrate 10 and the lower clad layer 20 at a center of the DBR section 12. For example, the air pocket 70 may be a region in which a portion of the lower clad layer 20 between the substrate 10 and the core layer 30 in the DBR section 12 is etched. In addition, the air pocket 70 may be a region in which a portion of the upper clad layer 40 and the protective layer 50 outside the core layer 30 is etched. The air in the air pocket 70 may reduce or minimize emission of conductive heat or radiation heat of the core layer 30 in the DBR section 12. The air pocket 70 may have an M shape in the second direction X.

The optical waveguide 86 may be disposed on the substrate 10 in the air pocket 70. The optical waveguide 86 may extend in the first direction Z. The laser light 18 may be transmitted along the optical waveguide 68. The optical waveguide 86 may include the lower clad layer 20, the core layer 30, the upper clad layer 40, the Bragg grating 42, the protective layer 50, and the first heater electrode 62 on the air pocket 70.

The peripheral part 72 may be disposed in edge regions E of the substrate 10. The air pocket 70 may be disposed within the peripheral part 72. The peripheral part 72 may include the lower clad layer 20, the upper clad layer 40, and the protective layer 50. In a vertical perspective, the air pocket 70 may expose sidewalls of the lower clad layer 20, the upper clad layer 40 and the protective layer 50 of the peripheral part 72.

Referring to FIG. 1, the edge hinges 82 and the center hinges 84 may be disposed in the air pocket 70. The edge hinges 82 and the center hinges 84 may connect the optical waveguide 68 to the peripheral part 72 in the second direction X. The edge hinges 82 and the center hinges 84 may have the same thickness in the first direction Z. For example, each of the edge hinges 82 and the center hinges 84 may have a thickness of about 1 μm to about 100 μm. The edge hinges 82 and the center hinges 84 may have different densities in the first direction Z. The center hinges 84 may be arranged densely when compared to the edge hinges 82.

Referring to FIG. 4, each of the center hinges 84 may have an M shape. In addition, the edge hinges 82 may have an M-shape, but the embodiment of the inventive concept is not limited thereto. Each of the edge hinges 82 and the center hinges 84 may include a lower hinge 83 and an upper hinge 85. The lower hinge 83 may include the lower clad layer 20. The upper hinge 85 may be disposed on the lower hinge 83. The upper hinge 85 may include the upper clad layer 40.

Figure 5:
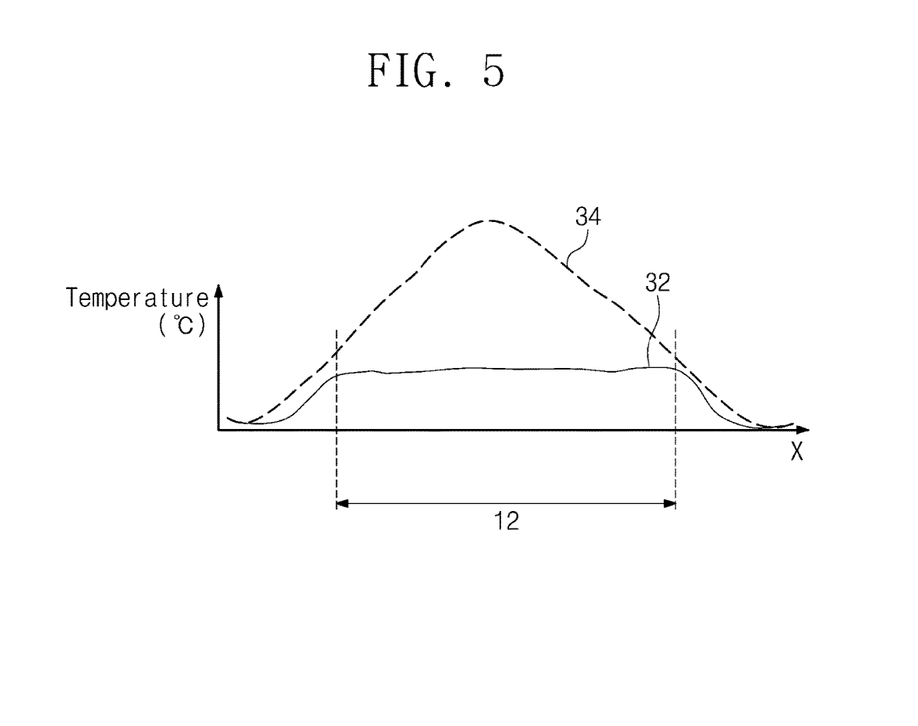
FIG. 5 is graphs illustrating a temperature of an optical waveguide connected to edge hinges and center hinges of FIG. 1 and a general temperature of an optical waveguide that is not connected to the edge hinges and the center hinges.

FIG. 5 is graphs illustrating a temperature 32 of the optical waveguide 68 connected to edge hinges 82 and center hinges 84 of FIG. 1 and a general temperature 34 of the optical waveguide that is not connected to the edge hinges 82 and the center hinges 84.

Referring to FIG. 5, the edge hinges 82 and the center hinges 84 may uniformly adjust a temperature 32 of the optical waveguide 68 within the DBR section 12 to improve wavelength-tunable efficiency.

On the other hand, the general temperature 34 of the optical waveguide that is not connected to the edge hinges and the center hinges may be non-uniformly controlled within the DBR section 12. The general temperature 34 at the center of the DBR section 12 may be measured to be higher than that of the edge of the DBR section 12. The optical waveguide that is not connected to the edge hinges and the center hinges may reduce the wavelength-tunable efficiency of the laser light 18.

Figure 6:
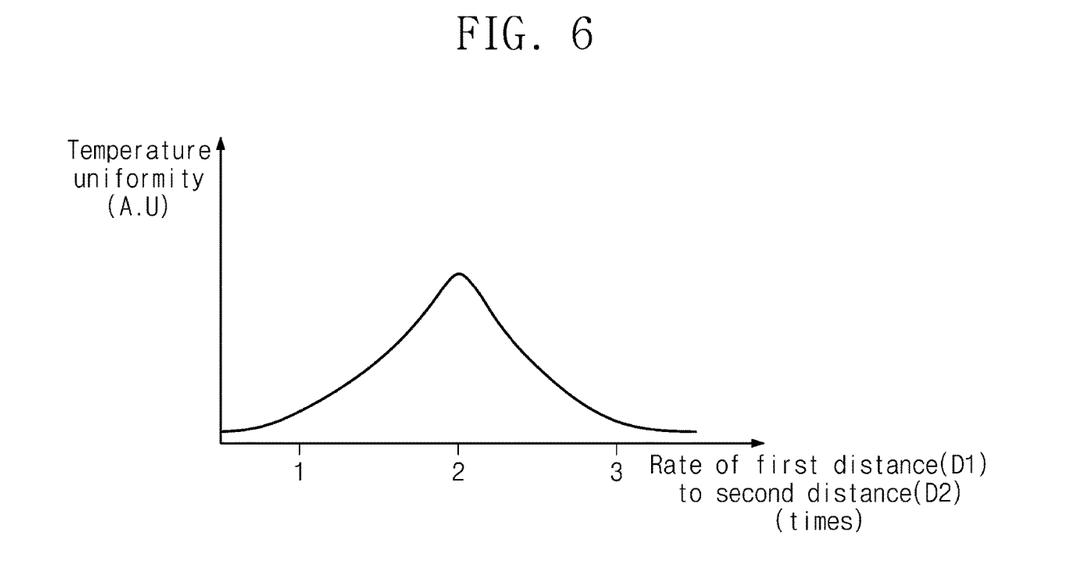
FIG. 6 is a graph illustrating temperature uniformity in a DBR section depending on a ratio of a first distance to a second distance of FIG. 2.

FIG. 6 is a graph illustrating temperature uniformity in the DBR section 12 depending on a ratio of a first distance D1 to a second distance D2 of FIG. 2.

Referring to FIG. 6, when the first distance D1 of the edge hinges 82 is twice the second distance D2 of the center hinges 84, the temperature uniformity of the optical waveguide 86 may maximally increase. That is, the edge hinges 82 having the first distance D1 that is greater twice than the second distance D2 between the center hinges 84 may maximally increase in temperature uniformity in the DBR section 12.

Figure 7:
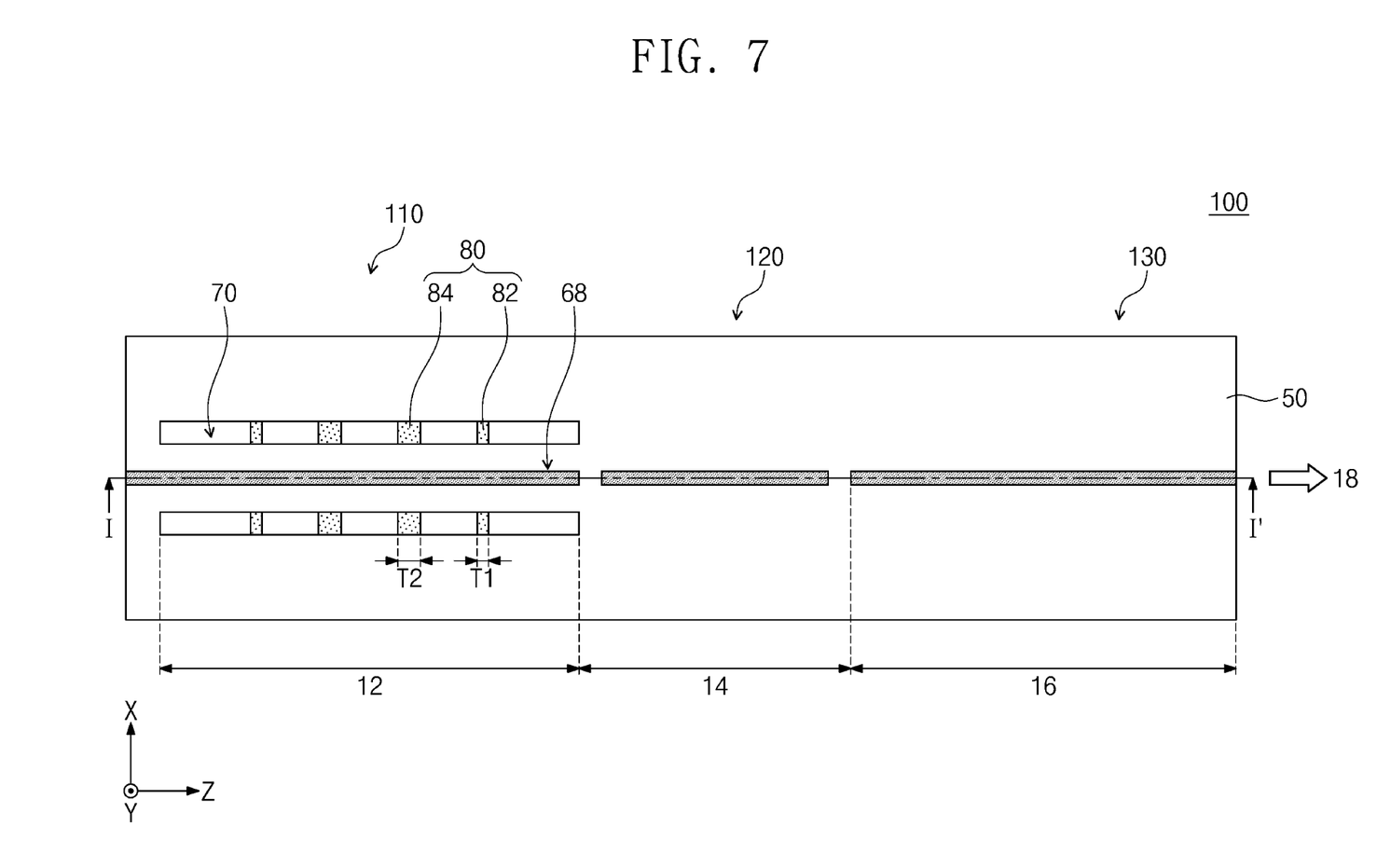
FIG. 7 is a plan view illustrating an example of the hinges of FIG. 1.

FIG. 7 is a plan view illustrating an example of the hinges of FIG. 1.

Referring to FIG. 7, the hinges 80 of the optical waveguide device 110 may have different thicknesses. The hinges 80 may be arranged at equal intervals in the first direction Z within the air pocket 70. For example, each of the center hinges 84 may be thicker than each of the edge hinges 82. Each of the edge hinges 82 may have a first thickness T1, and each of the center hinges 84 may have a second thickness T2 greater than the first thickness T1. For example, the second thickness T2 may be greater twice than the first thickness T1. The first thickness T1 may be about 1 μm to about 10 μm, and the second thickness T2 may be about 2 μm to about 20 μm.

The phase controller 120 and the active device 130 may be configured in the same manner as those illustrated in FIG. 1.

Figure 8:
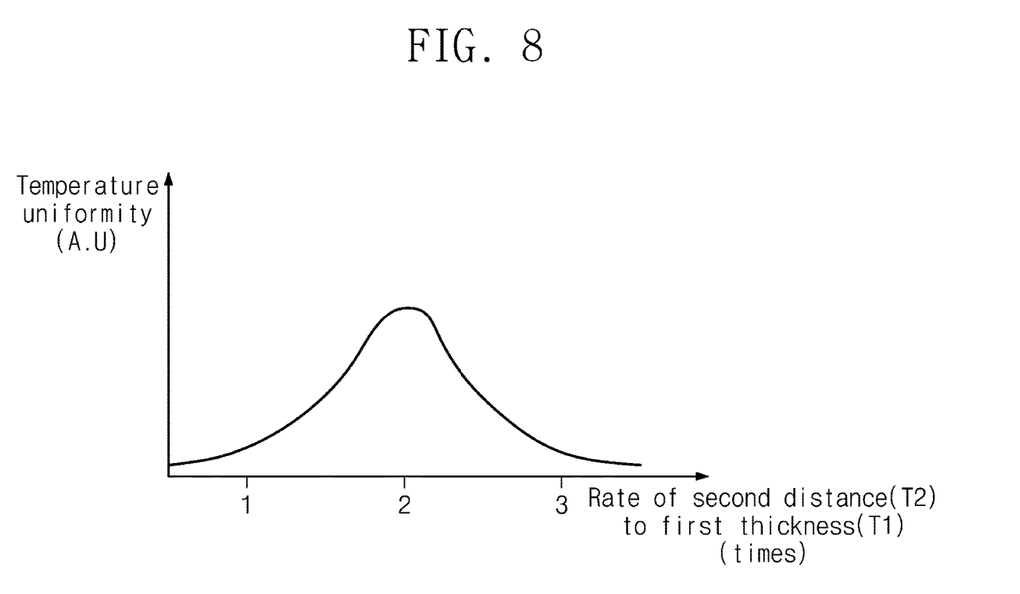
FIG. 8 is a graph illustrating temperature uniformity in a DBR section depending on a ratio of a second thickness to a first thickness of FIG. 7.

FIG. 8 is a graph illustrating temperature uniformity in the DBR section 12 depending on a ratio of a second thickness T2 to a first thickness T1 of FIG. 7.

Referring to FIG. 8, when the second thickness T2 of each of the center hinges 84 is greater twice than the first thickness T1 of each of the edge hinges 82, the temperature uniformity may maximally increase. The center hinges 84, each of which has a second thickness T2 that is greater twice than the first thickness T1 of each of the edge hinges 82 may allow the temperature uniformity in the DBR section 12 to maximally increase.

Figure 9:
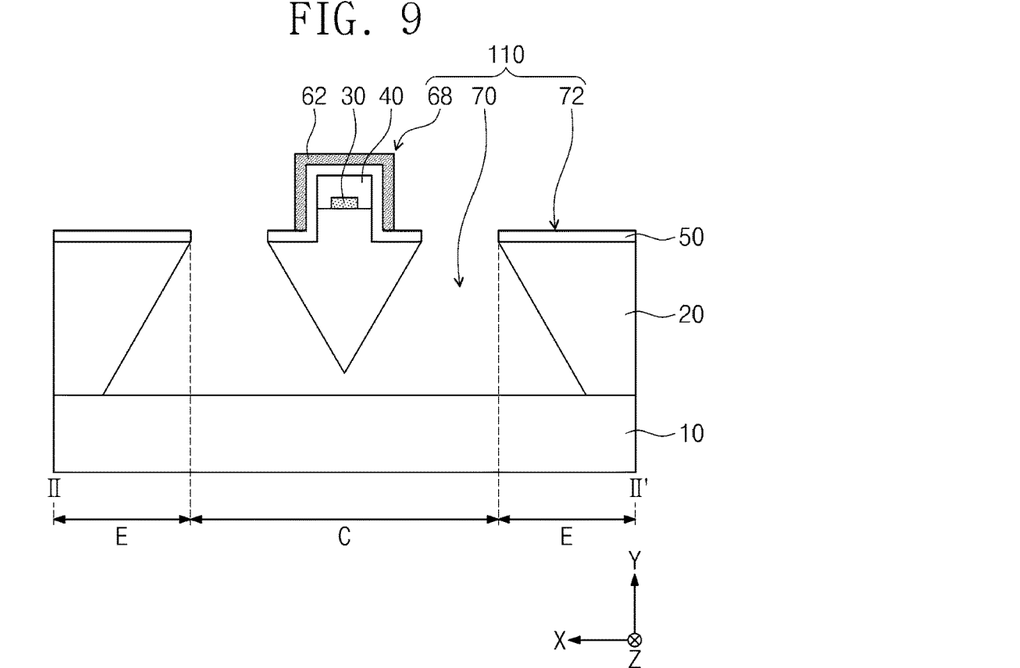
FIG. 9 is a cross-sectional view taken along line II-IF of FIG. 1.
Figure 10:
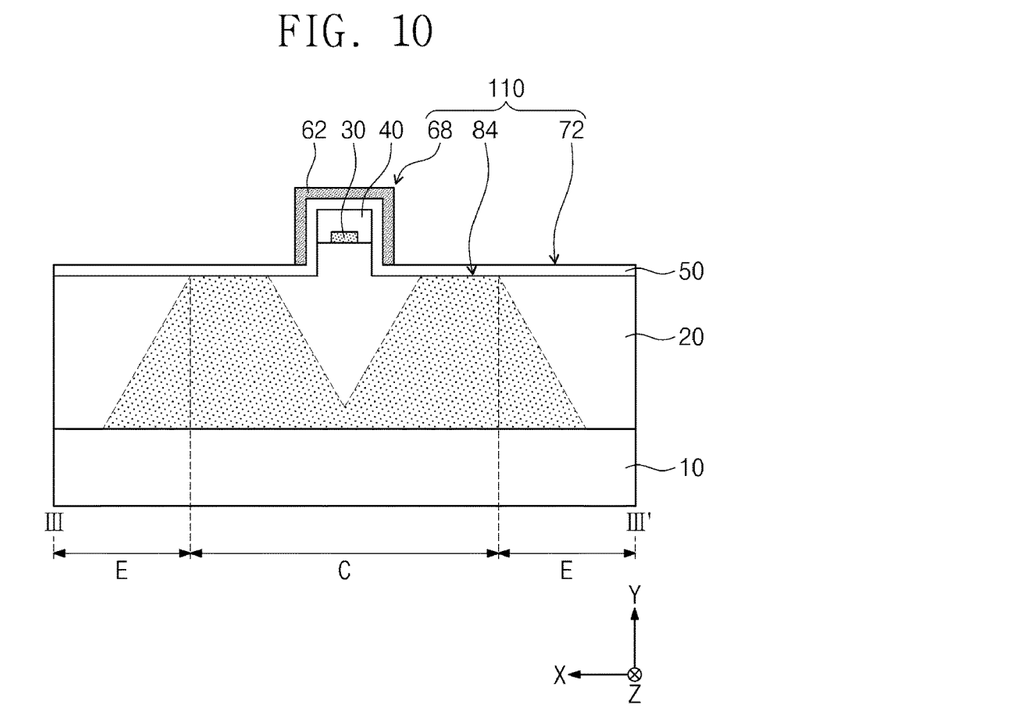
FIG. 10 is a cross-sectional view taken along line of FIG. 1.

FIG. 9 is a cross-sectional view taken along line II-IF of FIG. 1. FIG. 10 is a cross-sectional view taken along line of FIG. 1.

Referring to FIGS. 1, 9, and 10, the laser apparatus 100 according to an embodiment of the inventive concept may be a ridge-type distributed Bragg reflector laser apparatus. For example, the peripheral part 72 may include the lower clad layer 20 and the protective layer 50. The upper clad layer 40 may be separated from the air pocket 70 and the hinges 80. In the vertical perspective, the air pocket 70 may expose the sidewalls of the lower clad layer 20 and the protective layer 50 of the peripheral part 72. A top surface of the lower clad layer 20 may be stepped on the air pocket 70 and the hinges 80. For example, the optical waveguide 68 may include the lower clad layer 20, the core layer 30, the upper clad layer 40, the protective layer 50, and the first heater electrode 62. The uppermost surface of the lower clad layer 20 may be higher than a top surface of each of the center hinges 84 in the air pocket 70. Thus, the center hinges 84 may include the lower clad layer 20. Also, the edge hinges 82 may include the lower clad layer 20, but the embodiment of the inventive concept is not limited thereto.

The core layer 30 and the upper clad layer 40 may be disposed on the uppermost surface of the lower clad layer 20. The protective layer 50 may be disposed on the lower clad layer 20 and the sidewalls and top surfaces of and the upper clad layer 40. The first heater electrode 62 may be disposed on the top surfaces and sidewalls of the lower clad layer 20, the upper clad layer 40, and the protective layer 50 within the air pocket 70.

As described above, the optical waveguide device according to the embodiment of the inventive concept may uniformly control the temperature of the optical waveguide by using the plurality of hinges connecting the optical waveguide within the air pocket to the periphery of the air pocket.

The contents described above are specific examples for carrying out the embodiment of the inventive concept. The present disclosure will include not only the embodiments described above, but also embodiments that are changeable in design or easily changed. In addition, the present disclosure will also include technologies that are capable of being easily modified and implemented in the future using the foregoing embodiments.

What is claimed is:

1. An optical waveguide device comprising:
a peripheral part disposed on an edge region of a substrate;
an air pocket disposed on a central region of the substrate within the peripheral part;
an optical waveguide comprising a core layer, which is disposed on an upper portion of the substrate within the air pocket to extend in a first direction, and an electrode on the core layer; and
a plurality of fingers configured to adjust a temperature of the optical waveguide, disposed in the air pocket to connect the optical waveguide to the peripheral part in a second direction crossing the first direction,
wherein the plurality of fingers comprise edge fingers and center fingers between the edge fingers,
wherein the edge fingers are located at a first distance from a closest one, respectively, of the center fingers,
wherein the center fingers are separated from each other by a second distance that is less than the first distance, and
wherein each of the center fingers is thicker than each of the edge fingers.

2. The optical waveguide device of claim 1, wherein each of the edge fingers and the center fingers comprises:
a lower finger; and
an upper finger on the lower finger.

3. The optical waveguide device of claim 2, wherein the lower finger comprises a lower clad layer.

4. The optical waveguide device of claim 3, wherein the upper finger comprises an upper clad layer on the lower clad layer.

5. The optical waveguide device of claim 1, wherein the center fingers are denser than the edge fingers.

6. The optical waveguide device of claim 5, wherein the second distance is less than ½ of the first distance.

7. The optical waveguide device of claim 1, wherein each of the edge fingers has a first thickness, and
each of the center fingers has a thickness that is greater than twice the first thickness.

8. A laser apparatus comprising:
an active device disposed on one side of a substrate to generate laser light;
an optical waveguide device disposed on another side of the substrate to tune a peak wavelength of the laser light; and
a phase controller disposed on the substrate between the active device and the optical waveguide device to control a phase of the laser light,
wherein the optical waveguide device comprises:
a peripheral part disposed on an edge region of the substrate;
an air pocket disposed on a central region of the substrate within the peripheral part;
an optical waveguide comprising a core layer, which is disposed on an upper portion of the substrate within the air pocket to extend in a first direction, and an electrode on the core layer; and
a plurality of fingers configured to adjust a temperature of the optical waveguide, disposed in the air pocket to connect the optical waveguide to the peripheral part in a second direction crossing the first direction,
wherein the plurality of fingers comprises edge fingers and center fingers between the edge fingers,
wherein the edge fingers are located at a first distance from a closest one, respectively, of the center fingers,
wherein the center fingers are separated from each other by a second distance that is less than the first distance, and
wherein each of the center fingers is thicker than each of the edge fingers.

9. A laser apparatus comprising:
a substrate having a distributed Bragg reflector (DBR) section, a phase section, and a gain section;
a lower clad layer disposed on the substrate;
an air pocket disposed between the substrate and the lower clad layer in the DBR section;
a core layer disposed on the lower clad layer to extend in a first direction;

an upper clad layer disposed on the core layer and the lower clad layer outside the core layer;

a protective layer on the upper clad layer in the DBR section and the phase section;

electrodes aligned with the core layer and disposed on the protective layer in the DBR section and the phase section and on the upper clad layer in the gain section; and a plurality of fingers configured to adjust a temperature of the optical waveguide, disposed in the air pocket and separated from each other in the first direction, wherein the plurality of fingers comprise edge fingers disposed at an edge in the DBR section, and center fingers disposed at a center in the DBR section between the edge fingers, wherein each of the center fingers is thicker than each of the edge fingers.

10. The laser apparatus of claim 9, wherein the center fingers are denser than the edge fingers.

11. The laser apparatus of claim 10, wherein the edge fingers are located at a first distance from the center fingers, and the center fingers are separated from each other by a second distance that is less than ½ of the first distance.

12. The laser apparatus of claim 9, wherein each of the edge fingers has a first thickness, and each of the center fingers has a thickness that is greater than twice the first thickness.

13. The laser apparatus of claim 9, wherein the air pocket has an M shape in the second direction.

* * * * *